(12) United States Patent
Ichimaru

(10) Patent No.: US 6,622,010 B1
(45) Date of Patent: Sep. 16, 2003

(54) FREQUENCY SYNTHESIZER

(75) Inventor: Kouzou Ichimaru, Kunisaki-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 440 days.

(21) Appl. No.: 09/718,576

(22) Filed: Nov. 22, 2000

(30) Foreign Application Priority Data

Nov. 24, 1999 (JP) .......................................... 11-333173

(51) Int. Cl.$^7$ ................................................. H04B 1/40
(52) U.S. Cl. ...................... 455/76; 455/260; 331/1 R; 331/17
(58) Field of Search ...................... 455/76, 260, 165.1; 331/1 R, 2, 17, 41; 375/376

(56) References Cited

U.S. PATENT DOCUMENTS

| | | | | |
|---|---|---|---|---|
| 5,166,641 A | * | 11/1992 | Davis et al. ................ | 331/1 A |
| 5,276,913 A | * | 1/1994 | Lee et al. ..................... | 455/76 |
| 5,594,735 A | * | 1/1997 | Jokura ......................... | 370/337 |
| 5,794,130 A | * | 8/1998 | Abe et al. .................... | 455/76 |

| | | | | |
|---|---|---|---|---|
| 2002/0153960 A1 | * | 10/2002 | Ichimaru ..................... | 331/17 |

* cited by examiner

*Primary Examiner*—Lee Nguyen
(74) *Attorney, Agent, or Firm*—William B. Kempler; W. James Brady, III; Frederick J. Telecky, Jr.

(57) ABSTRACT

The present invention pertains to a type of frequency synthesizer which can correctly compensate for the ripple current. Frequency synthesizer 1 has PLL loop containing oscillator 31 and charge pump circuit 35. Also, the frequency synthesizer has compensating circuit 41 and correcting circuit 43. Said correcting circuit 43 has sense amplifier 44, up/down counter 45, and DA converter 40. The compensating circuit superimposes a compensating current onto the output current of charge pump circuit 35 which generates the control signal of oscillator 31, and it compensates for the ripple current contained in the output current. After the PLL loop is locked, sense amplifier 44 detects the ripple current with the superimposed compensating current, and based on the detection result, up/down counter 45 and DA converter 40 control compensating circuit 43, and the difference between the ripple current and the compensating current is reduced. Consequently, even when the ripple current varies due to variation in the circuit constants, etc., it is possible to cancel out the ripple current accurately.

2 Claims, 3 Drawing Sheets

FREQUENCY SYNTHESIZER

FIELD OF THE INVENTION

The present invention pertains to a frequency synthesizer. More specifically, the present invention pertains to a frequency synthesizer that can accurately compensate for ripple current.

BACKGROUND OF THE INVENTION

For a cellular phone of the multi-channel access type, in order to shift the current frequency to a vacant channel, there must be a frequency synthesizer that allows high-speed lock-up.

In FIG. 3, 101 represents a conventional frequency synthesizer used in a fractional frequency division type PLL (Phase Locked Loop) circuit.

Said frequency synthesizer 101 is set inside a semiconductor integrated circuit that forms the transceiver of the cellular phone. It has the following parts: oscillator 131, frequency divider 132, reference clock signal generator 133, phase comparator 134, charge pump circuit 135, low-pass filter 136, compensation circuit 137, and controller 138. In said oscillator 131, an external output signal OUT is generated at the prescribed frequency, and the external output signal OUT is output to frequency divider 132 and the other circuits in the semiconductor integrated circuit where said frequency synthesizer 101 is set.

Frequency divider 132 frequency divides the external output signal OUT that is input, and it generates a comparison signal that is output to phase comparator 134. Said phase comparator 134 compares the phase of the comparison signal input from frequency divider 132 with the phase of the reference clock signal input from reference clock signal generator 133, and outputs a signal corresponding to the phase difference to charge pump circuit 135. Based on the signal corresponding to the input phase difference, charge pump circuit 135 creates a positive/negative output current flow and this output current is output as a control signal through low-pass filter 136 to oscillator 131.

Based on the input control signal, oscillator 131 changes the frequency of external output signal OUT, and it operates such that the phase of the comparison signal comes into sync with the phase of the reference clock signal. As a result, the frequency of external output signal OUT is equal to the frequency of the reference clock signal times the frequency division value of frequency divider 132.

Said frequency divider 132 is controlled by controller 138, and the frequency division value is made to change periodically. As an example, when the frequency of the reference clock signal is 200 kHz, suppose the frequency division value is 5000 for the period of 7 cycles (35 μsec), and it is 5001 for the period of 1 cycle period (5 μsec). In this case, the average frequency division value for the 8 cycles is 5000.125(=5000+⅛), and the frequency of external output signal OUT is locked to 1000025 kHz, that is, the reference clock signal times the average frequency division value.

Suppose the frequency division value is 4000 for 6 cycles, and 4001 for 2 cycles during 8 cycles, the average frequency division value is 4000.25, and the frequency of external output signal OUT becomes 800.050 MHz.

In this way, when the average frequency division value has a value with precision to after the decimal point, it is possible to use high frequencies such as 800 MHz, 1 GHz, etc. with narrow channel intervals of 25 kHz, 12.5 kHz, etc.

However, when the frequency division value is changed periodically as aforementioned, even after the external output signal OUT is locked at the desired frequency, the phase of the comparison signal and the phase of the reference clock signal are not in sync, and there is a phase difference. Consequently, the control signal output from phase comparator 134 contains a ripple current.

In FIG. 4, a indicates the waveform of the comparison signal input from frequency divider 132 after external output signal OUT is locked as the frequency division value changes between N and N+1, b represents the waveform of the reference clock signal, and c represents the waveform of the ripple current in the control signal output from charge pump circuit 135 due to the fact that the phase of the comparison signal and the phase of the reference clock signal are not in sync.

The ripple current contained in the control signal generates spurious signals in the external output signal. This not only degrades the reception characteristics of cellular phones and other communications equipment, but it also becomes a component that degrades transmission. It is a serious problem.

In this frequency synthesizer 101 there is a compensating circuit 137 having a DA converter 141 and a capacitor 142. DA converter 141 changes the voltage applied to capacitor 142, and it generates a compensating current having the same charge quantity as the ripple current yet having an opposite sign. The compensating current is superimposed onto the control signal output from charge pump circuit 135. The ripple current is cancelled out. As a result, an external output signal OUT having no spurious components is obtained.

The charge quantity of the ripple current that varies over time changes such that it becomes an integer times a prescribed theoretical unit charge quantity. The theoretical unit charge quantity indicates the product of the phase difference between the comparison signal and the reference clock signal and the output current of charge pump circuit 135.

As an example, as aforementioned, when the frequency of external output signal OUT is 1000025 kHz, suppose the output current of charge pump circuit 135 is a constant current of +1 mA or −1 mA, the following $Q_r$ becomes the unit charge quantity:

$$Qr=(\tfrac{1}{8})\times(1/1000025 \text{ kHz})\times 1 \text{ mA}\times\tfrac{1}{2}=62.5\times10^{-15}(\text{Coulomb}) \quad (101)$$

Then, ripple current is generated at the same period as that of the reference clock signal with charge quantities from ±1 up to ±7 times said unit charge quantity $Q_r$ (±7$Q_r$) in the following order +7$Q_r$→+5$Q_r$→3$Q_r$→1$Q_r$→−1$Q_r$→−3$Q_r$→−5$Q_r$→−7$Q_r$.

In order to compensate for such ripple current, if the capacitance of capacitor 142 is $C_1$, voltage $V_e$ from the following formula:

$$C_i \cdot V_e = Q_r \quad (102)$$

is used as a unit by DA converter 141 to convert voltage $V_d$ applied to capacitor 142 in the following magnitudes and order: −7$V_e$, −5$V_e$, −3$V_e$, −1$V_e$, +1$V_e$, +3$V_e$, +5$V_e$, +7$V_e$, which results in a compensating current having the same charge quantity as that of the ripple current but having an opposite sign. The compensating current is superimposed onto the output current of charge pump circuit 135. In this way, the ripple current can be cancelled out.

As explained above, in said frequency synthesizer 101, a compensating current is preset so that by superimposition, the ripple current can be compensated for correctly. However, when the ripple current that is actually output varies due to certain reasons, such as variation in the circuit constants of the circuit elements, etc., it is impossible to compensate for the ripple current accurately.

A general object of the present invention is to solve the aforementioned problems of the conventional methods by providing a device which can accurately compensate for the ripple current.

SUMMARY OF THE INVENTION

The object and other features of the invention are attained, in accordance with one aspect of the invention by a frequency synthesizer characterized by the fact that it has he following parts: an oscillator, wherein the frequency of the output oscillating signal controlled corresponding to a control signal; a frequency divider of the fractional frequency dividing type which frequency-divides the aforementioned oscillating signal and generates a comparison signal; a reference clock signal generator which generates a reference clock signal; a phase comparator which compares the phase of said comparison signal and the phase of said reference clock signal and outputs a phase difference signal; a charge pump circuit which outputs current corresponding to the aforementioned phase difference signal; a low-pass filter which removes the high-frequency component of the current output from the aforementioned charge pump circuit and sends the resulting signal as the aforementioned control signal to the aforementioned oscillator; a switching circuit which is connected between the output terminals of the aforementioned charge pump circuit and the aforementioned low-pass filter; a compensating circuit which outputs a compensating current for compensating the ripple current contained in the aforementioned control signal to the output terminal of the aforementioned charge pump circuit; and a correcting circuit which detects the current at the output terminal of the aforementioned charge pump circuit and corrects the aforementioned compensating current.

In another aspect of the invention, the correcting circuit detects the current at the output terminal of the aforementioned charge pump circuit corresponding to the period of the aforementioned fractional frequency division of the aforementioned frequency divider, and the aforementioned switching circuit performs ON/OFF control corresponding to the period of the aforementioned fractional frequency division.

With the aforementioned constitution, in the present invention, the oscillating signal output from the oscillator is frequency divided by a frequency divider while the frequency division value is changed periodically, and a comparison signal and reference clock signal are output to the phase comparator.

The phase comparator operates a charge pump circuit and it compares the phase of the input reference clock signal with the phase of the comparison signal. Then, corresponding to the phase difference, a constant positive or negative output current flows from the charge pump circuit, high-frequency components are removed by a low-pass filter, and a control signal is generated.

The control signal is input to the oscillator, and based on this control signal, the oscillator changes the frequency of the oscillating signal in the direction that reduces the phase difference between the reference clock signal and the comparison signal. As a result, the frequency of the oscillating signal becomes the frequency of the reference clock signal times the average frequency division value.

In this frequency synthesizer, a compensating circuit is set, and a compensating current, which has a sign opposite to that of the ripple current in the output current of the charge pump circuit, is generated. When the compensating current is superimposed on the output current, the ripple current is cancelled out, and the spurious components are removed from the oscillating signal.

When the compensating current is set, in the prior art, the current level of the ripple current is determined beforehand, and the compensating current is preset so that it can accurately cancel out the ripple current. When the ripple current varies due to certain reasons, it becomes impossible to cancel out of the ripple current accurately.

According to the present invention, the frequency synthesizer has a compensating circuit. In the compensating circuit, the output current with the superimposed compensating current is detected directly. Based on the detection result of the detected output current, it is possible to adjust the current level of the compensating current. Consequently, even when the ripple current varies due to certain reasons, the current level of the compensating current can still be adjusted based on the current level of the varying ripple current.

Consequently, it is possible to adjust the current level of the compensating current corresponding to variations in the ripple current, and to cancel the ripple current correctly.

Also, in one aspect of the present invention the frequency synthesizer has a switching circuit, and the switching circuit can cut off between the output of the charge pump circuit and the input of the low-pass filter. At the desired timing, the compensating circuit detects the output current with the superimposed compensating current. Consequently, when the output of the charge pump circuit and the input of the low-pass filter are cut off from each other, it is possible to detect the output current with the superimposed compensating current.

Also, when the output current of the charge pump circuit is output through the low-pass filter, the ripple current is integrated by the low-pass filter. Consequently, the periodically varying ripple current is averaged, making it hard to detect. According to the present invention, it is possible to detect the output current of the charge pump with the superimposed compensating current directly. Consequently, it is possible to detect the current with a compensating current superimposed on a ripple current that has not been integrated or averaged. Consequently, it is possible to detect the ripple current reliably.

In addition, the ripple current usually varies periodically. If the overall ripple current level is low, because the output current is detected at a time when the current level of the ripple current is low, the detected output current is very small, and it may not be detectable in extreme cases. In this case, it is determined that there is no ripple current, and the ripple current cannot be cancelled out accurately. In the present invention, because it is possible to detect the output current with the superimposed compensating current at the desired timing. Consequently, it is possible to detect the output current at a time when the current level of the ripple current is higher.

Consequently, even in the case when the overall current level of the ripple current is low and it is hard to detect, the detected output current is still relatively large. Consequently, it is easy to detect the ripple current, and it is possible to detect the ripple current with high accuracy.

REFERENCE NUMERALS AND SYMBOLS AS SHOWN IN DRAWINGS

Figure 1:
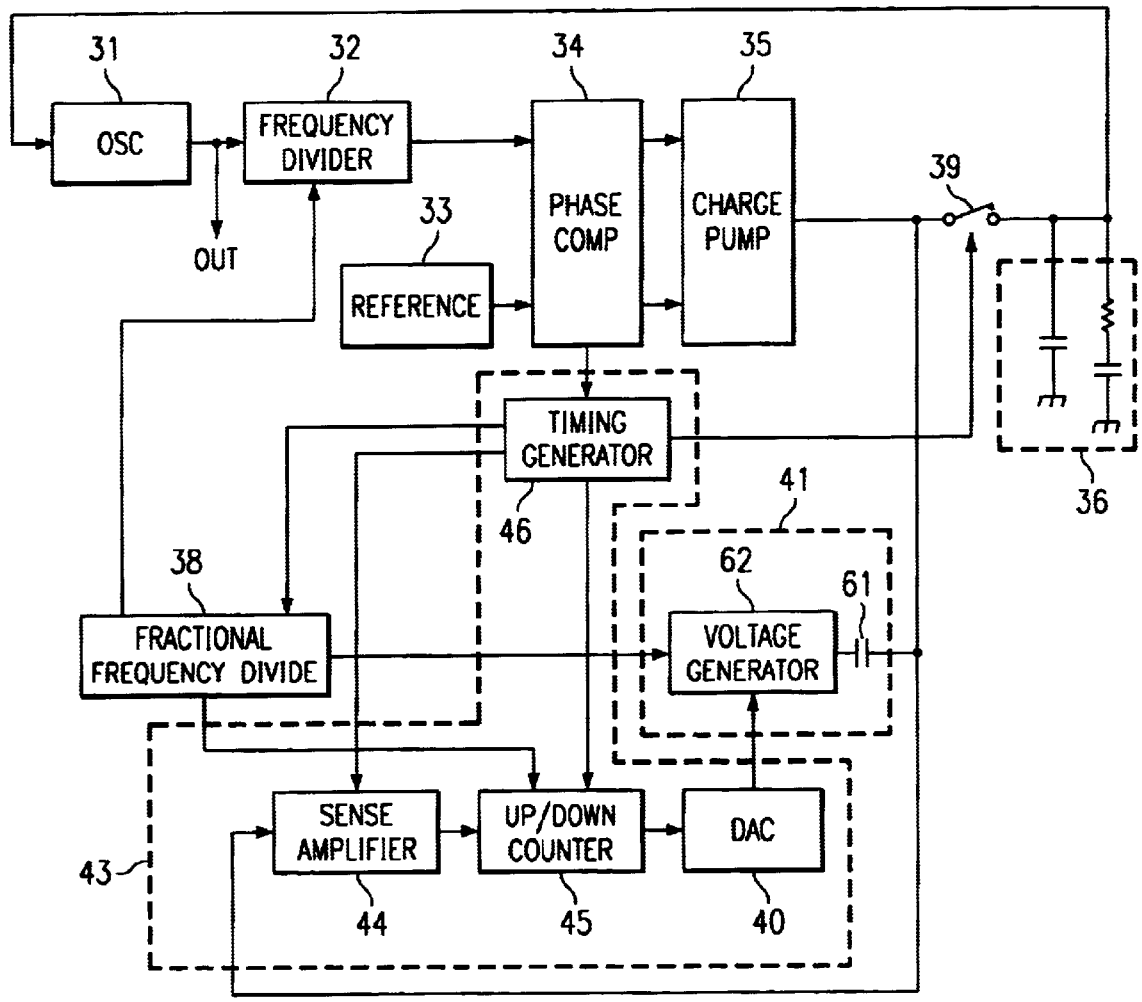
FIG. 1 is a block diagram illustrating an embodiment of the frequency synthesizer in the present invention.

In the figures 1 represents a frequency synthesizer, 31 oscillator, 32 frequency divider, 34 phase comparator, 35 charge pump circuit, 36 low-pass filter, 38 fractional frequency division controller, 41 compensating circuit, 43 correcting circuit.

DESCRIPTION OF EMBODIMENTS

In the following, an embodiment of the present invention will be explained with reference to figures.

In FIG. 1, 1 represents the frequency synthesizer in the embodiment of the present invention.

Said frequency synthesizer 1 is set in the semiconductor integrated circuit device that forms the transceiver of a cellular phone, and it has the following parts: oscillator 31, frequency divider 32, reference clock signal generator 33, phase comparator 34, charge pump circuit 35, low-pass filter 36, fractional frequency division controller 38, switching circuit 39, compensating circuit 41, and compensating circuit 43. Oscillator 31 outputs external output signal OUT. Said external output signal OUT is input to frequency divider 32 and the other circuits in the semiconductor integrated circuit that includes said frequency synthesizer 1.

Said frequency divider 32 is controlled by controller 38, and its structure is such that the frequency division value varies periodically. The input external output signal OUT is frequency-divided by the frequency division value to generate a comparison signal.

Reference clock signal generator 33 generates a reference clock signal at the prescribed frequency. This reference clock signal and the aforementioned comparison signal are input to phase comparator 34.

Phase comparator 34 compares the phases of the two signals and derives the phase difference. The signal indicating the phase difference is output to charge pump circuit 35.

Charge pump circuit 35 has a structure such that when the signal indicating the phase difference is input, a constant positive/negative current flows for a time corresponding to the phase difference, and this current is output to oscillator 31 through switching circuit 39 and low-pass filter 36 to oscillator 31.

When switching circuit 39 is ON, charge pump circuit 35 and low-pass filter 36 are connected to each other, and the output current of charge pump circuit 35 can be output to low-pass filter 36.

Low-pass filter 36 removes the high-frequency components of the constant positive/negative current that flows from charge pump circuit 35 and outputs a control signal to oscillator 31.

Upon the input control signal, oscillator 31 changes the frequency of external output signal OUT in the direction that reduces the phase difference between the phase of the comparison signal and the phase of the reference clock signal.

Compensating circuit 41 has compensating capacitor 61 and voltage generator 62.

One terminal of compensating capacitor 61 is connected to the output of charge pump circuit 35, and its other terminal is connected to the output of voltage 62. Also, there is an up/down counter 45 to be explained later in frequency synthesizer 1, and the prescribed digital data are preset in said up/down counter 45. Voltage generator 62 generates a voltage based on the prescribed digital data, and the voltage is output to compensating capacitor 61 for charging/discharging. In this way, the compensating current can be superimposed onto the output current of charge pump circuit 35.

In frequency synthesizer 1 with the aforementioned structure, switching circuit 39 is preset ON, wherein the output of charge pump circuit 35 and the input of low-pass filter 36 are connected. From oscillator 31, a feedback loop is formed back to oscillator 31 through frequency divider 32, phase comparator 34, charge pump circuit 35, switching circuit 39, and low-pass filter 36. With this configuration, when frequency synthesizer 1 is activated, the feedback loop performs the PLL operation, and a process is executed in which the error of the phase of the comparison signal output from frequency divider 32 with respect to the phase of the reference clock signal gradually becomes smaller as compared with that at start of the operation.

During the period until the PLL loop is locked, compensating circuit 41 generates a compensating current based on the prescribed digital data as explained above, and this current is superimposed onto the output current of charge pump circuit 35.

When the aforementioned operation is performed repeatedly, it is possible to synchronize the phase of the comparison signal to the phase of the reference clock signal. When the two phases are nearly in sync, and the frequency of external output signal OUT matches the reference clock signal times with the average frequency division value, the PLL loop enters a locked state.

As explained above, when the PLL loop is locked while the compensating current is being supplied, the time until the PLL loop is locked can be shortened with respect to the case when the PLL loop operation is performed while not supplying the compensating current.

However, because the ripple current is superimposed onto the control signal, there is also a correcting circuit 43 in frequency synthesizer 1 in this embodiment.

Said correcting circuit 43 has sense amplifier 44, up/down counter 45, DA converter 40, and timing generator 46.

The input of sense amplifier 44 is connected to the outputs of charge pump circuit 35 and compensating circuit 41, and it is possible to detect the output voltage of charge pump circuit 35 with the superimposed compensating current.

For up/down counter 45, its input is connected to the output of sense amplifier 44, and its output is connected to the input of DA converter 40, and it can output the preset digital data to DA converter 40. Based on the output of sense amplifier 44, the digital data is increased/decreased by 1, and it is possible to output the result to DA converter 40.

DA converter 40 DA converts the input digital data, and it outputs an analog signal corresponding to the magnitude of the digital data to voltage generator 62. By this analog signal, the output voltage level of voltage generator 62 is controlled, and it is possible to control the current level of the compensating current.

Here, the frequency division value of frequency divider 32 is explained with respect to an example. In this example, N is the value for a period of 7 cycles of the reference clock signal and N+1 is the value for a period of 1 cycle, where the 8 cycles consisting of the sum of the 7 cycles and 1 cycle form a unit (hereinafter referred to as a cycle of the fractional frequency division).

Variation takes place periodically, and the average frequency division value becomes N+⅛. Consequently, each cycle of the fractional frequency division contains 8 reference clock signals.

Timing generator 46 has a structure such that the reference clock signal can be input through phase comparator 34. After the PLL loop is locked, it can turn off switching circuit 39 twice during each cycle of the fractional frequency division. In this case, switching circuit 39 is set such that for the 8 reference clock signals contained in each cycle of the fractional frequency division, the switching circuit is turned off during the rising times of the first and the eighth reference clock signals.

In said frequency synthesizer 1, after the PLL loop is locked, timing generator 46 turns off switching circuit 39 and cuts off the PLL loop when switching circuit 39 is first turned off (that is, when the first reference clock signal rises within a cycle of the fractional frequency division).

In this case, the input of sense amplifier 44 remains connected to the outputs of charge pump circuit 35 and compensating circuit 41, and clipping is performed by low-pass filter 36.

As switching circuit 39 is turned off after the PLL loop is locked, only the ripple current is output from charge pump circuit 35. On the other hand, compensating circuit 41 also operates, and, in the locked state, a compensating current is output from compensating circuit 41 based on the prescribed digital data preset in up/down counter 45.

Consequently, at the output terminal of charge pump circuit 35, the compensating current is superimposed onto the ripple current output from charge pump circuit 35.

Sense amplifier 44 detects and amplifies the voltage at the output terminal of charge pump circuit 35, and outputs it as the first detection voltage to up/down counter 45. Said up/down counter 45 holds the input first detection voltage temporarily.

At the end of the detection operation of the first detection voltage, timing generator 46 again turns on switching circuit 39 that is in the OFF state, and the PLL loop is formed. Then, in the period until switching circuit 39 is turned off, switching circuit 39 is kept ON, and the PLL loop performs its operation.

Then, when switching circuit 39 is turned off (at the rising time of the eighth reference clock signal), timing generator 46 again turns off switching circuit 39, and the PLL loop is cut off. Then, the voltage at the output terminal of charge pump circuit 35 is input to sense amplifier 44. Sense amplifier 44 detects and amplifies the voltage of the output terminal of charge pump circuit 35, and it outputs the voltage as the second detection voltage to up/down counter 45.

At the input of the second detection voltage, up/down counter 45 subtracts the newly input second detection voltage from the stored first detection voltage. When the voltage value obtained by subtracting the second detection voltage from the first detection voltage is positive, the value of the prescribed digital data is increased by 1. On the other hand, if the result is negative, the value is decreased by 1. Then, the resulting value is output to DA converter 40. DA converter 40 D/A converts the input digital data, and it outputs an analog signal corresponding to the magnitude of the digital data to voltage generator 62.

For voltage generator 62, when the analog signal increases, it raises the voltage output to compensating capacitor 61 which raises the compensating current. When the analog signal decreases, it reduces the voltage output to compensating capacitor 61 which reduces the compensating current.

For frequency synthesizer 1, when the value obtained by subtracting the second detection voltage from the first detection voltage is positive, it increases the compensating current from the compensating current that has been output until locking. On the other hand, when said difference is negative, it decreases the compensating current.

Figure 2A:
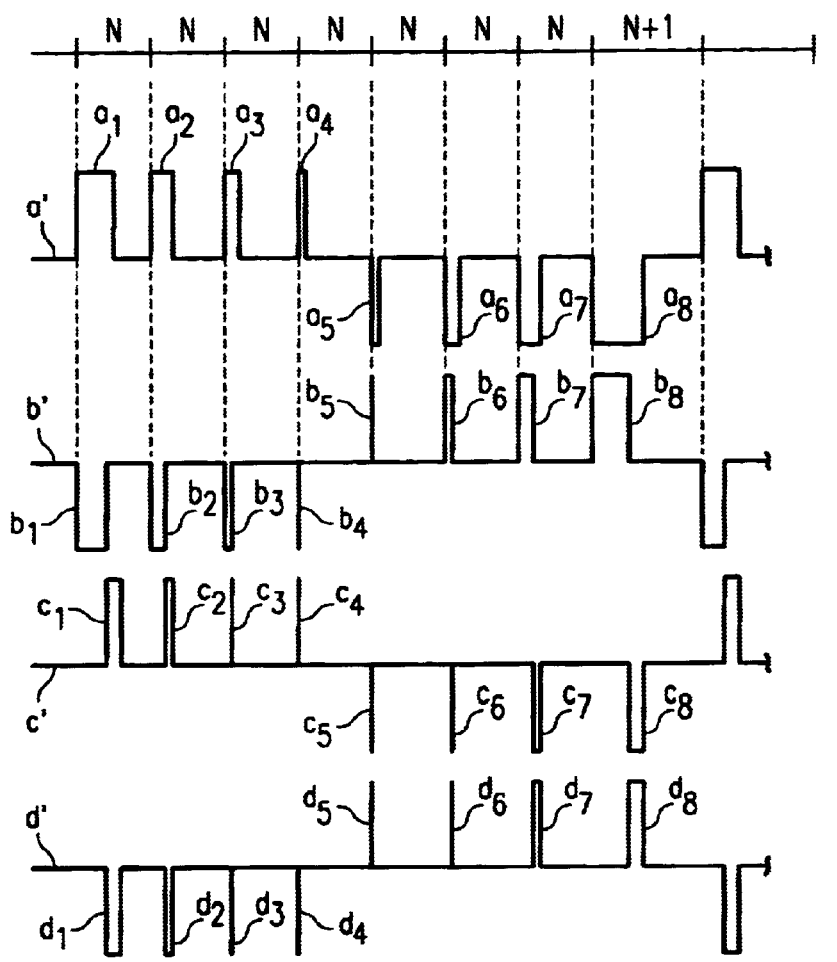
FIG. 2(a) is a timing diagram illustrating the relationship between the ripple current and the compensating current.

FIG. 2a is a diagram illustrating an example of the ripple current and the compensating current. In the figure, a represents the waveform of the ripple current output from charge pump circuit 35, and b represents the waveform of the compensating current. In each cycle of the fractional frequency division, the ripple currents that are generated at the output timing of the first through eighth reference clock signals are represented by $a_1$–$a_8$, respectively, and the compensating currents generated to cancel out said ripple currents $a_1$–$a_8$ are represented by $b_1$–$b_8$, respectively.

As shown in FIG. 2a, ripple currents $a_1$–$a_8$ generated at the output timing of the first through fourth reference clock signals have positive signs, while ripple currents $a_5$–$a_8$ generated at the output timing of the fifth through eighth reference clock signals have negative signs. The compensating currents have signs that are opposite the signs of ripple currents $a_1$–$a_8$.

Compensating currents $(b_1)$–$(b_4)$ have negative signs, and $(b_5)$–$(b_8)$ have positive signs. When the ripple current is larger than the compensating current, the waveform of the ripple current superimposed with the compensating current is represented by c. On the other hand, when the ripple current is smaller than the compensating current, the waveform of the ripple current superimposed with the compensating current is represented by d. In the figure, c1–c8 and d1–d8 represent the ripple currents superimposed with the compensating current when the first through eighth reference clock signals are output.

When the ripple current is larger than the compensating current, the first and second detection voltages correspond to $c_1$ and $c_8$ in FIG. 2a, respectively. When the ripple current is smaller than the compensating current, the first and second detection currents correspond to $d_1$ and $d_8$ in FIG. 2a, respectively. Waveforms c, and $c_8$ have a positive value and a negative value, respectively, and waveforms $d_1$ and $d_8$ have a negative value and a positive value, respectively.

When the ripple current is larger than the compensating current, the result obtained by subtracting the second detection voltage from the first detection voltage $c_1$–$c_8$ is positive. On the other hand, when the ripple current is smaller than the compensating current, the result obtained by subtracting the second detection voltage from the first detection voltage $d_1$–$d_8$ is negative.

On the other hand, as explained above, by operation of frequency synthesizer 1, when the value obtained by subtracting the second detection voltage from the first detection voltage is positive, the compensating current output until locking is increased. On the other hand, if the value is negative, the compensating current is decreased.

Consequently, by operation of frequency synthesizer 1, when the ripple current is larger than the compensating current, the compensating current is increased, and, when the ripple current is smaller than the compensating current, the compensating current is decreased. As a result, correction is performed to reduce the error of the ripple current with respect to the compensating current.

Then, during the next cycle of the fractional frequency division, the corrected compensating current is output. Then, when the first and eighth reference clock signals rise, the ripple current with the superimposed corrected compensating current is converted to voltage by sense amplifier 44, and the resulting voltages are stored by up/down counter 45 as the first and second detection voltages, respectively. Then, the second detection voltage is subtracted from the first detection voltage. Depending on whether the subtraction result is positive or negative, up/down counter 45 increases/decreases the corrected digital data by 1, so that the compensating current is corrected again, and the error of the compensating current with respect to the ripple current is further reduced.

In this way, for each cycle of the fractional frequency division, the correction of the compensating current is carried out repeatedly, and the error of the ripple current with respect to the compensating current is gradually decreased.

When the aforementioned operation is carried out repeatedly for a prescribed time, the error of the ripple current with respect to the compensating current decreases to within a prescribed tolerance range. Consequently, the correction operation of the compensating current comes to an end after a prescribed time has elapsed from the start of the correction operation of the compensating current. Even when the ripple current varies, the compensating current corrected by the aforementioned operation can compensate for the ripple current more accurately than the prior art.

As explained above, when the correction of the compensating current is finished, timing circuit 46 turns on switching circuit 39. After that, switching circuit 39 maintains the ON state, and frequency synthesizer 1 shifts to conventional PLL operation. In the conventional PLL operation, the final corrected compensating current is output from compensating circuit 41.

In said frequency synthesizer 1, during a cycle of the fractional frequency division, switching circuit 39 is turned off during the first and eighth cycles of the reference clock signal, and the ripple current with the superimposed compensating current is detected. The reason is as follows.

Figure 2B:
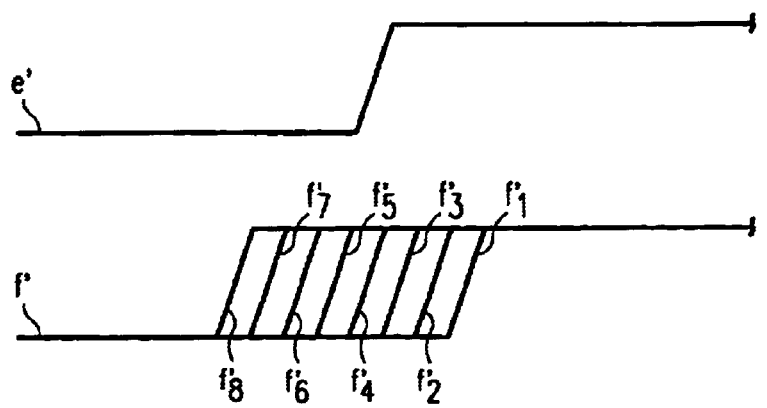
FIG. 2(b) is a diagram illustrating the deviation of the phase between the reference clock signal and the output signal of the frequency divider.
Figure 3:
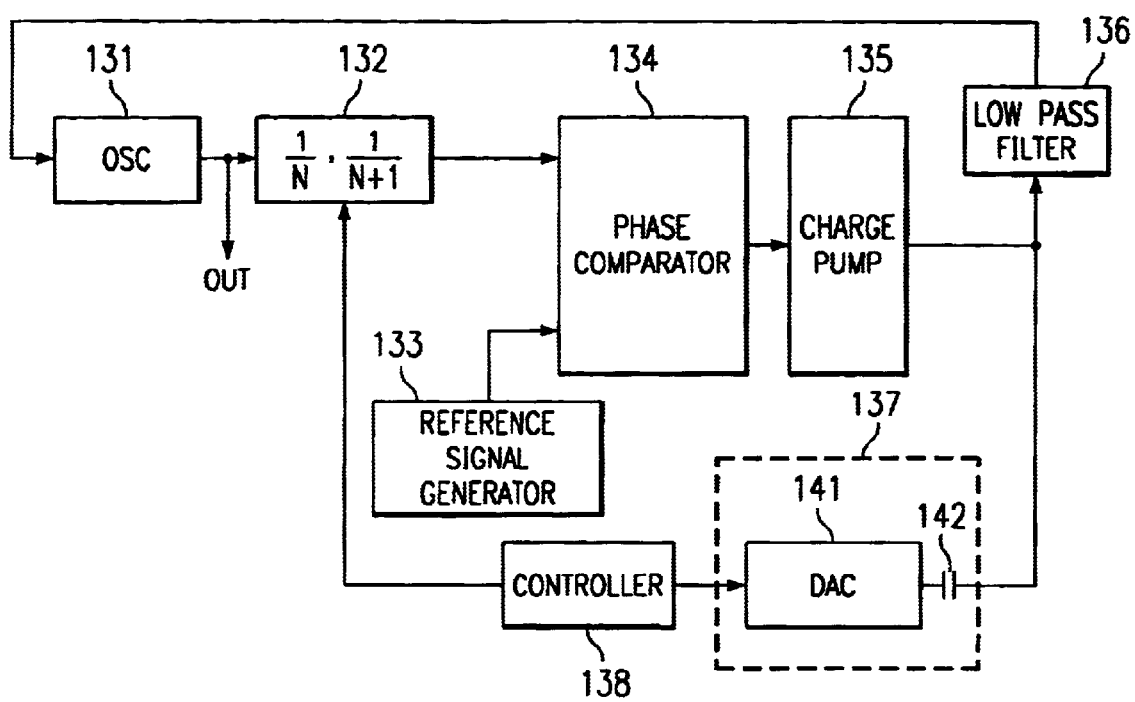
FIG. 3 is a block diagram illustrating a conventional frequency synthesizer.
Figure 4:
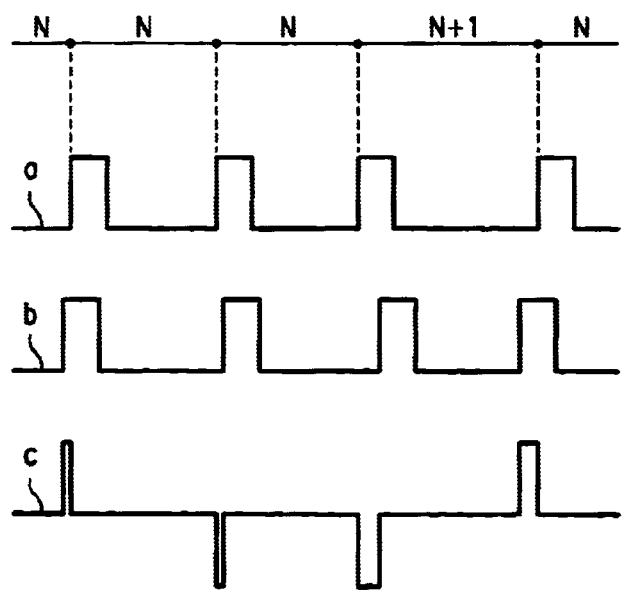
FIG. 4 is a timing diagram illustrating the ripple current.

In FIG. 2b, e' represents the phase of the reference clock signal, and $f_1'$–$f_8'$ represent the deviations in the phase of the comparison signal with respect to the phase of the reference clock signal. Here, $f_1'$–$f_8'$ represent the corresponding phases when the first through eighth reference clock signals are output during one cycle of the fractional frequency division.

As shown in FIG. 2b, for the frequency division value of N, that is, during the time from the first cycle to the seventh cycle of the reference clock signal, the phase of the comparison signal deviates from $f_2'$ to $f_8'$, and, for the frequency division value of (N+1), that is, during the eighth cycle of the reference clock signal, the phase of the comparison signal deviates from $f_8'$ to $f_1'$. Because the deviation of the phase with respect to the phase of the reference clock signal is at a maximum when the phase is $f_1'$ and $f_8'$, the ripple current caused by the phase deviation is also at a maximum in this case.

In this way, when the phase is $f_1'$ and $f_8'$, that is, during the time when the ripple current is at a maximum, as the ripple current with the superimposed compensating current is detected, even when the current level of the overall ripple current is low, as the detected output current is relatively large, it becomes easier to detect the ripple current, and it is possible to detect and cancel out the ripple current reliably.

Consequently, in this embodiment, during the first and eighth cycles of the reference clock signal, the ripple current with the superimposed compensating current, is detected.

In the aforementioned embodiment, that is a sense amplifier 44 in correcting circuit 43, the ripple current superimposed on the compensating current is converted to a voltage, by compensating capacitor 61, and the voltage is then detected by sense amplifier 44. However, the present invention is not limited to this configuration. It is also possible to adopt a configuration in which the ripple current with the superimposed compensating current is detected directly, and the compensating current is controlled based on the current level.

In the aforementioned embodiment, an explanation has been given with respect to the case when eight cycles of the reference clock signal are contained in a period of the fractional frequency division. However, the present invention is not limited to this configuration. For example, it is also possible for 16 cycles of the reference clock signal to be contained in one cycle of the fractional frequency division.

In addition, in the embodiment explained above, the frequency division value is N for the first cycle through the seventh cycle of the reference clock signal, and the frequency division value becomes (N+1) in the eighth cycle. However, the present invention is not limited to this configuration. It is also possible to adopt a configuration in which the frequency division value is (N+1) only during the fifth cycle, while the frequency division value is N for the others. In this case, the ripple current is at a maximum during the fifth cycle and sixth cycle of the reference clock signal during the periods when the frequency division value changes from N to (N+1). Consequently, at this time, one may just change the switching circuit 39 to the OFF state and detect the ripple current with the superimposed compensating current.

Also, in the aforementioned embodiment, the ripple current with the superimposed compensating current is detected twice within one cycle of the fractional frequency division, the first and second detection voltages are derived, their difference is determined, and, depending on the sign of the difference, the relationship of the magnitude between the ripple current and the compensating current is judged. However, the present invention is not limited to this configuration. It is also possible to adopt a configuration in which the magnitude relationship between the ripple current and the compensating current can be judged based on the sign of the detection voltage obtained from a single round of detection. In this case, two detections in one cycle of the fractional frequency division are not required, and at least one round of detection is enough.

Even when the ripple current varies due to variation in the circuit constants, a compensating current can be generated corresponding to the variation and superimposed onto the ripple current. Consequently, it is possible to cancel out the ripple current accurately.

What is claimed is:

1. Frequency synthesizer comprising:
   an oscillator, wherein the frequency of the output oscillating signal is controlled corresponding to a control signal;
   a frequency divider of the fractional frequency dividing type which frequency-divides the oscillating signal and generates a comparison signal;
   a reference clock signal generator which generates a reference clock signal;
   a phase comparator which compares the phase of said comparison signal and the phase of said reference clock signal and generates a phase difference signal;

a charge pump circuit which generates a corresponding to the phase difference signal;

a low-pass filter which removes the high-frequency component of the current generated by the charge pump circuit and sends the resulting signal as the control signal to the oscillator;

a switching circuit which is connected between the output terminals of the charge pump circuit and the low-pass filter;

a compensating circuit which generates a compensating current for compensating the ripple current contained in the control signal to the output terminal of the charge pump circuit;

and a correcting circuit which detects the current at the output terminal of the charge pump circuit and corrects the compensating current.

2. The frequency synthesizer described in claim 1, wherein in the correcting circuit detects the current at the output terminal of the charge pump circuit corresponding to the period of the fractional frequency division of the frequency divider, and the switching circuit performs ON/OFF control corresponding to the period of the fractional frequency division.

* * * * *